United States Patent [19]

Robb et al.

[11] Patent Number: 5,257,155
[45] Date of Patent: Oct. 26, 1993

[54] SHORT-CIRCUIT PROOF FIELD EFFECT TRANSISTOR

[75] Inventors: Stephen P. Robb; Robert E. Rutter, both of Tempe, Ariz.

[73] Assignee: Motorola, Inc., Schaumburg, Ill.

[21] Appl. No.: 749,020

[22] Filed: Aug. 23, 1991

[51] Int. Cl.⁵ ............................................. H02H 7/10
[52] U.S. Cl. .................................................... 361/18
[58] Field of Search ...................... 361/18, 91, 98, 111

[56] References Cited

U.S. PATENT DOCUMENTS 4,937,697  6/1990  Edwards et al. ...................... 361/18

*Primary Examiner*—Todd E. DeBoer
*Attorney, Agent, or Firm*—Bradley J. Botsch, Sr.

[57] ABSTRACT

A protection circuit for providing short-circuit protection for a field effect transistor has been provided. The protection circuit senses when the voltage appearing at the gate and drain electrodes of the field effect transistor are both at a logic high voltage level, and responds to turn off the field effect transistor thereby preventing damage to the field effect transistor.

12 Claims, 1 Drawing Sheet

SHORT-CIRCUIT PROOF FIELD EFFECT TRANSISTOR

BACKGROUND OF THE INVENTION

This invention relates to circuits, for example, a circuit to provide short-circuit protection for a field effect transistor.

There are numerous applications in electrical systems where short-circuit protection for a power device is desired. For instance, if a load coupled to the power device is inadvertently shorted, the power device will conduct an excessive current at an elevated voltage which typically results in destruction of the power device.

At least one attempt to provide short-circuit protection for a power device includes sensing the current through the power device by monitoring the voltage across a sense resistor which is coupled in series with the power device. When the current through the power device reaches a predetermined level, the voltage across the sense resistor turns on a bipolar transistor thereby reducing the drive to the power device. However, this attempt dissipates a large amount of power and possesses a high on-resistance.

Another attempt at providing short-circuit protection for a power device includes monitoring the temperature of the die of which the power device is fabricated on. In this attempt, the power device is turned off when the temperature of the die exceeds a predetermined limit. However, if destruction to the power device occurs before the temperature exceeds the predetermined limit, this attempt becomes futile.

Hence, there exists a need for an improved circuit to provide short-circuit protection for a power device.

SUMMARY OF THE INVENTION

Briefly, there is provided a protection circuit for a field effect transistor, the field effect transistor having gate, source and drain electrodes, the protection circuit comprising a sensing circuit having an input and an output, the input of the sensing circuit being coupled to the drain electrode of the field effect transistor for detecting when the voltage appearing at the drain electrode of the field effect transistor exceeds a predetermined voltage; a delay circuit having an input and an output, the input of the delay circuit being coupled to receive a control signal; a gate circuit having first and second inputs and an output, the first and second inputs of the gate circuit being respectively coupled to the outputs of the delay circuit and the sensing circuit, the output of the gate circuit providing a logic signal to the gate electrode of the field effect transistor; and a first resistor coupled between the input of the delay circuit and the gate electrode of the field effect transistor.

The present invention will be better understood from the following detailed description taken in conjunction with the accompanying drawings.

DETAILED DESCRIPTION OF THE DRAWINGS

Figure 1:
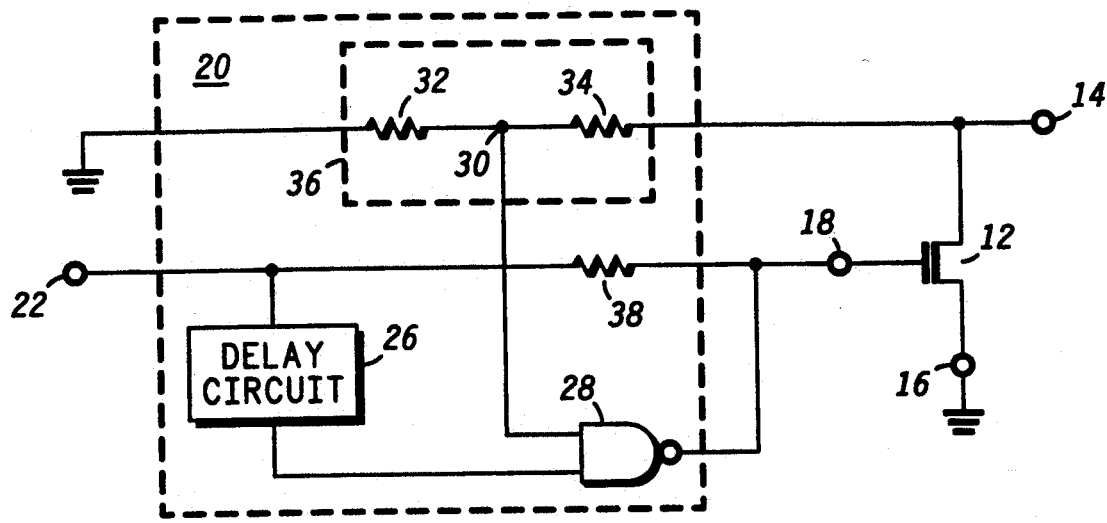
FIG. 1 is a partial schematic/block diagram illustrating a short-circuit proof field effect transistor in accordance with the present invention.

Referring to FIG. 1, a partial schematic/block diagram illustrating short-circuit proof field effect transistor circuit 10 is shown comprising field effect transistor (FET) 12 having its drain, source and gate electrodes respectively coupled to terminals 14, 16 and 18.

Protection circuit 20 has a first input coupled to terminal 14 and a second input coupled to terminal 22 at which a drive signal for FET 12 is provided. The output of protection circuit 20 is coupled to terminal 18.

It is understood that short-circuit proof field effect transistor circuit 10 has a control input coupled to terminal 22, and current carrying electrodes coupled to terminals 14 and 16.

Protection circuit 20 includes delay circuit 26 having an input coupled to terminal 22 and an output coupled to a first input of NAND gate 28. The second input of NAND gate 28 is coupled to circuit node 30 whereby circuit node 30 is returned to ground through resistor 32. Further, circuit node 30 is coupled to terminal 14 via resistor 34. Resistors 32 and 34 form sense circuit 36 which is used to sense the voltage appearing at terminal 14. That is, as the voltage at terminal 14 increases, the voltage at circuit node 30 also increases.

The output of NAND gate 28 is coupled to terminal 18. Further, resistor 38 is coupled between terminals 22 and 18.

Briefly, protection circuit 20 detects when a short-circuit condition through a load (not shown) which is coupled in series with terminal 14 occurs. In response to the short-circuit condition, protection circuit 20 functions to turns off the gate drive to FET 12 thereby preventing damage to FET 12.

In normal operation, if the voltage applied at terminal 22 is a logic high voltage level, the voltage appearing at the drain of FET 12 should fall to a logic low voltage level within a short time interval.

However, if the voltage appearing at terminals 14 and 22 are both at a logic high voltage level, then a short-circuit condition exists.

In particular, the voltage appearing at the drain electrode of FET 12 is sensed via sense circuit 36. That is, when the voltage appearing at the drain electrode of FET 12 reaches a first predetermined voltage, the voltage appearing at circuit node 30 reaches a second predetermined voltage. This second predetermined voltage is indicative of a logic high voltage level and is applied to the second input of NAND gate 28.

In addition, the signal applied to terminal 22 is delayed by a predetermined time via delay circuit 26, and is then applied to the first input of NAND gate 28. If both signals appearing at first and second inputs of NAND gate 28 are at a logic high voltage level, NAND gate 28 responds to provide a logic low voltage level to the gate electrode of FET 12 thereby turning off FET 12 thereby preventing damage to FET 12.

It is understood that delay circuit 26 allows the voltage appearing at the drain electrode of FET 26 to fall to a logic low voltage level during normal operation, as aforedescribed. Thus, when a logic high voltage level is applied to terminal 22, protection circuit 20 will not turn off FET 12 if the voltage at the drain electrode of FET 12 reaches a logic low voltage level within a predetermined time.

Figure 2:
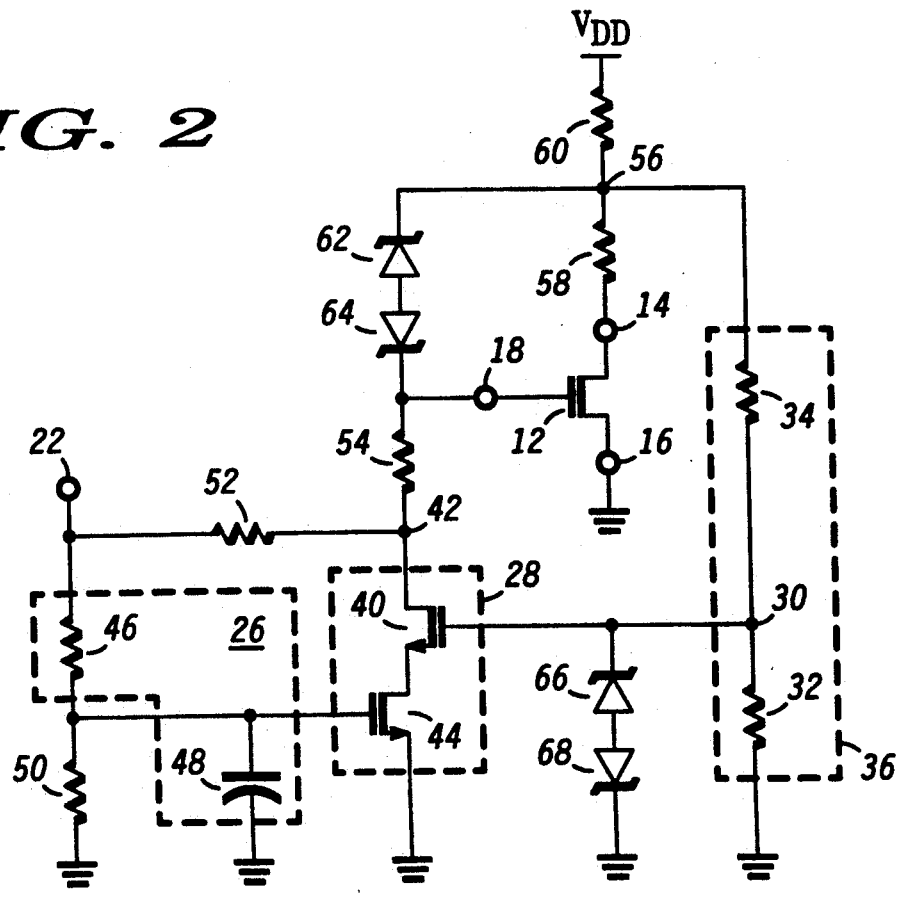
FIG. 2 is a detailed schematic diagram illustrating a short-circuit proof field effect transistor in accordance with the present invention.

Referring to FIG. 2, a detailed schematic diagram illustrating short-circuit proof field effect transistor circuit 10 is shown. It is understood that components shown in FIG. 2 which are identical to components shown in FIG. 1 are identified by like reference numbers.

NAND gate 28 is formed by field effect transistors (FET's) 40 and 44 wherein FET 40 has a drain electrode coupled to circuit node 42 and a gate electrode coupled to circuit node 30. The source electrode of FET 40 is coupled to the drain electrode of FET 44, the latter having a source electrode coupled returned to ground.

Delay circuit 26 is formed by resistor 46 and capacitor 48. The first terminal of resistor 46 is coupled to terminal 22, while the second terminal of resistor 46 is coupled to the gate electrode of FET 44 and to the first terminal of capacitor 48. The second terminal of capacitor 48 is returned to ground.

Resistor 50 is coupled between the second terminal of resistor 46 and ground potential. In particular, for the case of slowly rising signals at terminal 22, resistor 50 ensures that FET 12 turns on before FET 44 turns on.

The circuit of FIG. 2 further includes resistor 52 coupled between terminal 22 and circuit node 42, and resistor 54 coupled between terminal 18 and circuit node 42.

Terminal 14 is coupled to circuit node 56 via resistor 58 wherein circuit node 56 is coupled to circuit node 30 via resistor 34. Circuit node 56 is also coupled through load resistor 60 to a first supply voltage terminal.

Back-to-back diodes 62 and 64 have respective cathodes which are coupled to terminals 56 and 18. The anode of diode 62 is coupled to the anode of diode 64. Diodes 62 and 64, in conjunction with resistor 54, provide a clamping means for FET 12 when switching inductive loads coupled to the drain electrode of FET 12.

Likewise, back-to-back diodes 66 and 68 have respective cathodes which are coupled to circuit node 30 and ground potential. The anode of diode 66 is coupled to the anode of diode 68. Diodes 66 and 68 function to limit the maximum voltage appearing at the gate electrode of FET 40 to a predetermined value thereby preventing destruction to NAND gate 28.

The operation of the circuit shown in FIG. 2 is identical to the aforedescribed operation for the circuit shown in FIG. 1. Briefly, when the gate electrodes of 40 and 44 are at a logic high voltage level, the gate electrode of FET 12 is pulled to a logic low voltage level wherein the voltage across resistor 52 increases thereby decreasing the voltage at the gate of FET 12.

By now it should be apparent from the foregoing discussion that a novel protection circuit for providing short-circuit protection for a field effect transistor has been provided. The protection circuit senses when the voltage appearing at the gate and drain electrodes of the field effect transistor are both at a logic high voltage level, and responds to turn off the field effect transistor.

While the invention has been described in conjunction with specific embodiments thereof, it is evident that many alterations, modifications and variations will be apparent to those skilled in the art in the light of the foregoing description. Accordingly, it is intended to embrace all such alterations, modifications and variations in the appended claims.

We claim:

1. A protection circuit for a field effect transistor, the field effect transistor having gate, source and drain electrodes, the protection circuit comprising:

single-ended sensing means having an input and an output, said input of said sensing means being coupled to the drain electrode of the field effect transistor for detecting when a voltage appearing at the drain electrode of the field effect transistor exceeds a predetermined voltage, said sensing means including:

a first resistor having first and second terminals, said first terminal of said first resistor being coupled to said input of said sensing means, said second terminal of said first resistor being coupled to said output of said sensing means; and a second resistor having first and second terminals, said first terminal of said second resistor being coupled to said second terminal of said first resistor, said second terminal of said second resistor being coupled to a first supply voltage terminal;

a delay circuit having an input and an output, said input of said delay circuit being coupled to receive a control signal;

gate circuit means having first and second inputs and an output for turning off said first field effect transistor when said voltage appearing at said drain electrode of said first field effect transistor is in a similar logic state as a voltage applied to said gate electrode of said first field effect transistor, said first and second inputs of said gate circuit means being respectively coupled to said outputs of said delay circuit and said sensing means, said output of said gate circuit means being coupled to the gate electrode of the field effect transistor; and a third resistor coupled between said input of said delay circuit and said output of said gate circuit means.

2. The protection circuit according to claim 1 wherein said gate circuit means includes:

a first field effect transistor having first, second and control electrodes, said first electrode of said first field effect transistor being coupled to said output of said gate circuit means, said gate electrode of said first field effect transistor being coupled to said output of said sensing means; and a second field effect transistor having first, second and control electrodes, said first electrode of said second field effect transistor being coupled to said second electrode of said first field effect transistor, said gate electrode of said second field effect transistor being coupled to said output of said delay circuit, and said second electrode of said second field effect transistor being coupled to said first supply voltage terminal.

3. The protection circuit according to claim 2 wherein said delay circuit includes:

a fourth resistor having first and second terminals, said first terminal of said fourth resistor being coupled to said input of said delay circuit, said second terminal of said fourth resistor being coupled to said output of said delay circuit; and a capacitor having first and second terminals, said first terminal of said capacitor being coupled to said second terminal of said fourth resistor, said second terminal of said fourth resistor being coupled to said first supply voltage terminal.

4. The protection circuit according to claim 3 further including a clamping circuit coupled to said gate electrode of said first field effect transistor for limiting the voltage applied to said gate electrode of said first field effect transistor.

5. The protection circuit according to claim 4 further including a fifth resistor coupled between said output of said gate circuit means and the gate electrode of the field effect transistor.

6. The protection circuit according to claim 5 further including a sixth resistor coupled between said output of said delay circuit and said first supply voltage terminal.

7. A short-circuit proof field effect transistor circuit, comprising:
- a first field effect transistor having gate, source and drain electrodes; said source electrode of said first field effect transistor being coupled to a first supply voltage terminal;
- single-ended sensing means having an input and an output, said input of said sensing means being coupled to the drain electrode of said first field effect transistor for detecting when a voltage appearing at said drain electrode of said first field effect transistor exceeds a predetermined voltage, said sensing means including:
- a first resistor having first and second terminals, said first terminal of said first resistor being coupled to said input of said sensing means, said second terminal of said first resistor being coupled to said output of said sensing means; and
- a second resistor having first and second terminals, said first terminal of said second resistor being coupled to said second terminal of said first resistor, said second terminal of said second resistor being coupled to said first supply voltage terminal;
- a delay circuit having an input and an output, said input of said delay circuit being coupled to receive a control signal;
- gate circuit means having first and second inputs and an output for turning off said first field effect transistor when said voltage appearing at said drain electrode of said first field effect transistor is in a similar logic state as said voltage applied to said gate electrode of said first field effect transistor, said first and second inputs of said gate circuit means being respectively coupled to said outputs of said delay circuit and said sensing means, said output of said gate circuit means being coupled to said gate electrode of said first field effect transistor; and
- a third resistor coupled between said input of said delay circuit and said output of said gate circuit means.

8. The short-circuit proof field effect transistor circuit according to claim 7 wherein said gate circuit means includes;
- a second field effect transistor having first, second and control electrodes, said first electrode of said second field effect transistor being coupled to said output of said gate circuit means, said gate electrode of said second field effect transistor being coupled to said output of said sensing means; and
- a third field effect transistor having first, second and control electrodes, said first electrode of said third field effect transistor being coupled to said second electrode of said second field effect transistor, said gate electrode of said third field effect transistor being coupled to said output of said delay circuit, and said second electrode of said third field effect transistor being coupled to said first supply voltage terminal.

9. The protection circuit according to claim 8 wherein said delay circuit includes:
- a fourth resistor having first and second terminals, said first terminal of said fourth resistor being coupled to said input of said delay circuit, said second terminal of said fourth resistor being coupled to said output of said delay circuit; and
- a capacitor having first and second terminals, said first terminal of said capacitor being coupled to said second terminal of said fourth resistor, said second terminal of said fourth resistor being coupled to said first supply voltage terminal.

10. The protection circuit according to claim 9 further including a clamping circuit coupled to said gate electrode of said second field effect transistor for limiting the voltage applied to said gate electrode of said second field effect transistor.

11. The protection circuit according to claim 10 further including a fifth resistor coupled between said output of said gate circuit means and said gate electrode of said first field effect transistor.

12. The protection circuit according to claim 11 further including a sixth resistor coupled between said output of said delay circuit and said first supply voltage terminal.

* * * * *